(12) United States Patent
Koh et al.

(10) Patent No.: US 6,689,253 B1
(45) Date of Patent: Feb. 10, 2004

(54) FACING TARGET ASSEMBLY AND SPUTTER DEPOSITION APPARATUS

(75) Inventors: Chinsoon Koh, Singapore (SG); Stephen Hiroshi Sawasaki, Singapore (SG); Jianzhong Shi, Singapore (SG); Yuanda Randy Cheng, Singapore (SG)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 10/170,195

(22) Filed: Jun. 13, 2002

Related U.S. Application Data

(60) Provisional application No. 60/298,596, filed on Jun. 15, 2001.

(51) Int. Cl.[7] .............................................. C23C 14/35
(52) U.S. Cl. ........................... 204/191.01; 204/192.15; 204/192.2; 204/298.12; 204/298.18; 204/298.21; 204/298.22
(58) Field of Search ..................... 204/192.12, 192.15, 204/192.2, 298.12, 298.18, 298.21, 298.22

(56) References Cited

U.S. PATENT DOCUMENTS

| | | | | |
|---|---|---|---|---|
| 3,878,085 A | * | 4/1975 | Corbani ................. | 204/298.21 |
| 5,891,311 A | * | 4/1999 | Lewis et al. ............ | 204/192.12 |
| 6,337,001 B1 | * | 1/2002 | Haag et al. ............. | 204/192.2 |
| 6,497,803 B2 | * | 12/2002 | Glocker et al. ........ | 204/298.21 |

FOREIGN PATENT DOCUMENTS

| | | | | |
|---|---|---|---|---|
| JP | 02-050958 | * | 2/1990 | ............ 204/298.12 |

* cited by examiner

Primary Examiner—Rodney G. McDonald
(74) Attorney, Agent, or Firm—McDermott, Will & Emery

(57) ABSTRACT

A facing target sputtering apparatus, comprising:
  inner and outer spaced-apart, concentric, and coextensive tubular cathodes open at each end, with the inwardly facing surface of the outer cathode and the outwardly facing surface of the inner cathode;
  a first pair of ring-shaped magnet means extending around the outwardly facing surface of the outer cathode at the ends thereof, with a first polarity magnetic pole facing the outwardly facing surface;
  a second pair of ring-shaped magnet means extending around the inwardly facing surface of the inner cathode at the ends thereof, with a second, opposite polarity magnetic pole facing the inwardly facing surface; and
  a substrate positioned in spaced adjacency to an end of the inner and outer cathodes; wherein:
  magnetic flux lines from the first and second pairs of magnet means uni-directionally pass through portions of an annularly-shaped space between the ends of the inner and outer cathodes, and during sputtering operation, plasma is substantially confined to the portion of the annularly-shaped space between the magnetic flux lines.

19 Claims, 2 Drawing Sheets

FACING TARGET ASSEMBLY AND SPUTTER DEPOSITION APPARATUS

CROSS-REFERENCE TO PROVISIONAL APPLICATION

This application claims priority from U.S. provisional patent application Ser. No. 60/298,596 filed Jun. 15, 2001, the entire disclosure of which is incorporated herein by reference.

FIELD OF THE INVENTION

The present invention relates to a method and apparatus for forming high quality sputtered films on a substrate surface, e.g., a disk-shaped substrate, which method and apparatus utilize a magnetically enhanced facing target assembly. The invention has particular utility in the manufacture of disk-shaped, thin-film magnetic and magneto-optical (MO) recording media.

BACKGROUND OF THE INVENTION

Magnetic and MO media are widely employed in various applications, particularly in the computer industry for data/information storage and retrieval purposes. A magnetic medium in, e.g., disk form, such as utilized in computer-related applications, comprises a non-magnetic substrate, e.g., of glass, ceramic, glass-ceramic composite, polymer, metal, or metal alloy, typically an aluminum (Al)-based alloy such as aluminum-magnesium (Al—Mg), having at least one major surface on which a layer stack comprising a plurality of thin film layers constituting the medium are sequentially deposited. Such layers may include, in sequence from the substrate deposition surface, a plating layer, e.g., of amorphous nickel-phosphorus (Ni—P), a polycrystalline underlayer, typically of chromium (Cr) or a Cr-based alloy such as chromium-vanadium (Cr—V), a magnetic layer, e.g., of a cobalt (Co)-based alloy, and a protective overcoat layer, typically of a carbon-based material having good mechanical (i.e., tribological) properties. A similar situation exists with MO media, wherein a layer stack is formed which comprises a reflective layer, typically of a metal or metal alloy, one or more rare-earth thermomagnetic (RE-TM) alloy layers, one or more dielectric layers, and a protective overcoat layer, for functioning as reflective, transparent, writing, writing assist, and read-out layers, etc.

According to conventional manufacturing methodology, a majority of the above-described layers constituting multi-layer magnetic and/or MO recording media are deposited by cathode sputtering, typically by direct current (DC) sputtering utilizing a magnetically enhanced, facing target sputtering apparatus, such as illustrated in FIG. 1 in schematic, simplified cross-sectional view. As shown in the figure, such conventionally configured, magnetically enhanced facing target sputtering apparatus comprises a pair of spaced-apart, planar targets (cathodes) with their respective sputtering (front) surfaces in facing relation, with a respective annular-shaped magnet extending around the rear peripheral edge of each target for providing a magnetic field extending perpendicularly to the sputtering surfaces. During operation, the perpendicular magnetic field serves to confine the plasma which is generated to a zone within the inter-target space, as indicated by the dashed line in the figure. A substrate, illustratively a disk-shaped substrate, is positioned as shown, i.e., outside of the plasma zone, in order to effect damage-free, low roughness (i.e., smooth) film deposition on the substrate surface facing the plasma zone. Placement of the substrate exteriorly of the plasma zone also serves to minimize the frequency or number of film defects, such as may result from various phenomena, e.g., arcing, which may occur between the facing targets. However, conventional magnetically enhanced, facing target sputtering apparatus, such as shown in FIG. 1, are unsuitable for manufacturing high areal recording density magnetic media, e.g., perpebndicular and anti-ferromagnetically coupled (AFC) media, because good film uniformity over the entire substrate (i.e., disk) surface is not achievable unless the targets are extremely large, relative to the substrate.

In general, conventional magnetically enhanced sputtering methods and apparatus, e.g., DC magnetron sputtering methods and apparatus, incur four major deficiencies when utilized in the manufacture of thin film magnetic and magneto-optical (MO) recording media, which deficiencies are:

1. high micro-roughness at interfaces between adjacent thin films;
2. high frequency of film defects arising from arcing between facing targets, target flaking, and shield flaking;
3. poor thickness uniformity across the disk diameter; and
4. poor stability and repeatability when depositing ultra-thin films.

More specifically, in the manufacture of thin film, multi-layered magnetic and MO recording media, roughness at the interface between adjacent thin film layers exerts a significant influence on lattice matching between the adjacent layers; film stress and strain; formation of defects, such as stacking faults, etc., which factors ultimately determine the performance properties or characteristics of the media.

In particular, interfacial roughness is a very critical factor in the performance of anti-ferromagnetically coupled (AFC) media, wherein a very thin non-magnetic spacer layer, e.g., of ruthenium (Ru), only several atom layers thick, is formed between adjacent ferromagnetic layers. Since the interfacial roughness of multi-layer thin film structures produced by conventional sputtering techniques is rather high, the coupling coefficient J of such AFC media is much lower than that which is predicted from theory, which phenomena severely limits the applicability/utility of such media.

Roughness of conventional magnetron sputtered films is typically related to bombardment of the substrate by electrons and/or other negatively charged particles during the sputter deposition process, since the substrate is immersed in, or closely adjacent to, the plasma zone. The greater the bombardment, the greater the roughness. In addition, interaction between the substrate and the plasma arising from the relative positioning of the former and the latter can disadvantageously result in significant loss of manufacturing (i.e., product) yield in mass production. However, as indicated supra, conventional magnetically enhanced, facing target sputtering apparatus, wherein the substrate(s) is (are) positioned outside of the intense plasma zone or region, such as the facing target sputtering apparatus shown in FIG. 1, are unsuitable for manufacturing high areal recording density magnetic media, e.g., perpendicular and anti-ferromagnetically coupled (AFC) media, because good film uniformity over the entire substrate (i.e., disk) surface is not achievable unless the targets are extremely large, relative to the substrate. However, the use of large target sputtering apparatus incurs several significant disadvantages including, inter alia, increased sputtering station size, target power and pumping requirements, and substantially increased target material costs.

Accordingly, there exists a need for improved means and methodology for depositing, by sputtering techniques and at deposition rates consistent with the throughput requirements of automated manufacturing processing, defect-free thin films of high purity and with low interfacial roughness and good film thickness uniformity, suitable for use in high areal recording density, multi-layer magnetic recording media, such as hard disks. More specifically, there exists a need for means and methodology which overcome the above-mentioned drawbacks and disadvantages associated with conventional facing target sputtering means and methodology when utilized in the manufacture of single- and/or dual-sided magnetic and/or MO recording media, as in the form of hard disks, or in the manufacture of various other products and manufactures comprising at least one thin film layer.

The present invention addresses and solves the above-described problems and drawbacks associated with the use of conventional facing target sputtering means and methodology when utilized in the manufacture of high quality multi-layer film structures and recording media, notably the requirement for extremely large target sizes, while maintaining full capability with all aspects of conventional automated manufacturing technology therefor. Further, the means and methodology afforded by the present invention enjoy diverse utility in the manufacture of various devices and articles requiring high quality, defect-free, multi-layer thin film structures with low interfacial roughness and good thickness uniformity.

DISCLOSURE OF THE INVENTION

An advantage of the present invention is an improved facing target sputtering source.

Another advantage of the present invention is an improved apparatus for sputter coating a substrate surface, comprising an improved facing target sputtering source.

Yet another advantage of the present invention is an improved method of sputter depositing a layer of a target material on a substrate surface, comprising utilizing an improved facing target sputtering source.

Still another advantage of the present invention is an improved method for depositing at least one layer of a thin-film, multi-layer magnetic or magneto-optical (MO) recording medium, comprising utilizing an improved facing target sputtering source.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to a aspect of the present invention, the foregoing and other advantages are obtained in part by a facing target sputtering source, comprising:

(a) a first tubular cathode open at each end and having inwardly and outwardly facing surfaces, at least the inwardly facing surface comprised of a target material to be sputtered;

(b) a second tubular cathode open at each end, co-extensive with and concentrically positioned within the first tubular cathode with an elongated, annularly-shaped space therebetween, the second cathode having inwardly and outwardly facing surfaces, at least the outwardly facing surface comprised of the target material to be sputtered;

(c) a first pair of ring-shaped magnet means extending around the outwardly facing surface of the first tubular cathode at respective ends thereof, with a first polarity magnetic pole of each of the first pair of magnet means facing the outwardly facing surface of the first cathode; and (d) a second pair of ring-shaped magnet means extending around the inwardly facing surface of the second tubular cathode at respective ends thereof, with a second, opposite polarity magnetic pole of each of the second pair of magnet means facing the inwardly facing surface of the second cathode, whereby:

magnetic flux lines from each of the first and second pairs of magnet means unidirectionally passes through portions of the annularly-shaped space between the first and second tubular cathodes at respective ends thereof, and during sputtering operation, plasma is substantially confined to the portion of the annularly-shaped space between the magnetic flux lines from the first and second pairs of magnet means.

According to certain embodiments of the present invention, each of the first and second tubular cathodes (a) and (b) is cylindrical-shaped; and each of the first and second pairs of magnet means (c) and (d) comprises electromagnet or permanent means, which permanent magnet means (c) and (d) may, according to embodiments of the invention, comprise a plurality of permanent magnets with the same magnetic polarity orientation.

Another aspect of the present invention is an apparatus for sputter coating at least one surface of at least one substrate/workpiece, comprising the above facing target sputter source and at least one substrate/workpiece mounting means for positioning at least one substrate/workpiece in spaced adjacency to an end of the sputter source for receipt of sputtered particle flux emanating from the annularly-shaped space between the first and second tubular cathodes.

According to embodiments of the present invention, the at least one substrate/workpiece mounting means is adapted for positioning at least one surface of a disk-shaped substrate/workpiece for sputter coating thereon.

Embodiments of the present invention include apparatus comprising a pair of substrate/workpiece mounting means for positioning a pair of substrates/workpieces in spaced adjacency to respective ends of the sputter source for receipt of sputtered particle flux emanating from the annularly-shaped space between the first and second tubular cathodes; wherein each of the pair of substrate/workpiece mounting means is adapted for positioning a surface of a disk-shaped substrate/workpiece for sputter coating thereon.

Further embodiments of the present invention include apparatus comprising a coaxial, tandem spaced-apart pair of the facing target sputtering sources, the at least one substrate/workpiece mounting means being located in the space between the pair of sputtering sources for positioning at least one substrate/workpiece in spaced adjacency to respective ends of the sputter sources for receipt of sputtered particle flux on opposite surfaces of the substrate/workpiece, wherein the at least one substrate/workpiece mounting means is adapted for positioning a disk-shaped substrate/workpiece for sputter coating on opposite surfaces thereof.

Yet another aspect of the present invention is a method of sputter depositing a layer of a target material on at least one surface of at least one substrate/workpiece, comprising the steps of:

(a) providing a facing target sputtering source for generating a sputtered particle flux, comprising:

(i) a first tubular cathode open at each end and having inwardly and outwardly facing surfaces, at least the inwardly facing surface comprised of a target material to be sputtered;

(ii) a second tubular cathode open at each end, co-extensive with and concentrically positioned within the first tubular cathode with an elongated, annularly-shaped space therebetween, the second cathode having inwardly and outwardly facing surfaces, at least the outwardly facing surface comprised of the target material to be sputtered;

(iii) a first pair of ring-shaped magnet means extending around the outwardly facing surface of the first tubular cathode at respective ends thereof, with a first polarity magnetic pole of each of the first pair of magnet means facing the outwardly facing surface of the first cathode; and (iv) a second pair of ring-shaped magnet means extending around the inwardly facing surface of the second tubular cathode at respective ends thereof, with a second, opposite polarity magnetic pole of each of the second pair of magnet means facing the inwardly facing surface of the second cathode;

(b) passing magnetic flux lines from each of the first and second pairs of magnet means unidirectionally through portions of the annularly-shaped space between the first and second tubular cathodes at respective ends thereof;

(c) generating a sputtering plasma between the first and second cathodes which is confined to the portion of the annularly-shaped space between the magnetic flux lines from the first and second pairs of magnet means; and (d) positioning at least one substrate/workpiece in spaced adjacency to an end of the sputter source for receipt of sputtered particle flux emanating from the annularly-shaped space between the first and second tubular cathodes.

According to embodiments of the present invention, step (d) comprises positioning at least one surface of a disk-shaped substrate/workpiece for sputter coating thereon.

In accordance with further embodiments of the present invention, step (d) comprises positioning a pair of substrates/workpieces in spaced adjacency to respective ends of the sputter source for receipt of sputtered particle flux emanating from the annularly-shaped space between the first and second tubular cathodes, wherein step (d) further comprises positioning a pair of disk-shaped substrates/workpieces for sputter coating thereon.

According to still further embodiments of the present invention, step (a) comprises providing a coaxial, tandem spaced-apart pair of the facing target sputtering sources; and step (d) comprises positioning the at least one substrate/workpiece in the space between the pair of sputtering sources in spaced adjacency to respective ends of the sputter sources for receipt of sputtered particle flux on opposite surfaces of the substrate/workpiece, wherein step (d) further comprises positioning a disk-shaped substrate/workpiece for sputter coating on opposite surfaces thereof.

In accordance with certain embodiments of the present invention, step (a) comprises providing a facing target sputtering source wherein at least the inwardly facing surface of the first tubular cathode (i) and at least the outwardly facing surface of the second tubular cathode (ii) are comprised of a target material for forming a layer of a thin-film, multi-layer magnetic or magneto-optical (MO) recording medium.

According to particular embodiments of the present invention, step (a) comprises providing a said facing target sputtering source wherein each of the first and second tubular cathodes (i) and (ii) are cylindrical-shaped; and step (d) comprises positioning at least one surface of a disk-shaped substrate/workpiece for sputter coating at least one layer of the thin-film, multi-layer magnetic or MO recording medium thereon.

A still further aspect of the present invention is a facing target sputter source, comprising:

(a) first and second spaced-apart, elongated, co-extensive, and concentrically positioned tubular sputtering targets; and (b) means for substantially confining sputtering plasma to an annularly-shaped spaced between sputtering surfaces of each of the targets.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon recognition by the inventors that the above-described limitations/drawbacks inherent in sputter deposition processing utilizing conventional, planar facing target sputtering apparatus, e.g., as utilized in the manufacture of disk-shaped magnetic and/or MO recording media, particularly high areal recording density AFC and perpendicular media, arising from the inability of conventional facing target sputtering methodology/apparatus to provide good film thickness uniformity over the entire substrate (i.e., disk) surface, unless the targets are extremely large, relative to the substrate, can be avoided by use of a novel facing target sputtering assembly/apparatus utilizing a pair of concentrically arranged, tubular, open-ended sputtering targets, with magnetic confinement of the sputtering plasma to an annularly-shaped zone or space between facing target surfaces of the inner and outer sputtering targets, and placement of at least one substrate/workpiece (e.g., a disk-shaped substrate for a magnetic or MO recording medium) opposite an end of the facing target sputtering assembly, away from the magnetically confined plasma zone. As a consequence of the symmetry of the target assembly and the substrate/workpiece, deposition of a uniform thickness thin film over the entire surface of the substrate/workpiece is enabled. Moreover, the likelihood of defect formation in the thin film is very low because phenomena such as arcing during plasma operation is limited to the annular space or region between the concentric target surfaces. As a consequence, sputtered thin films and multi-layer stacks of thin films formed according to the inventive methodology exhibit optimal properties when utilized in the manufacture of thin-film magnetic and MO recording media, including high areal recording density AFC and perpendicular media.

Figure 1:
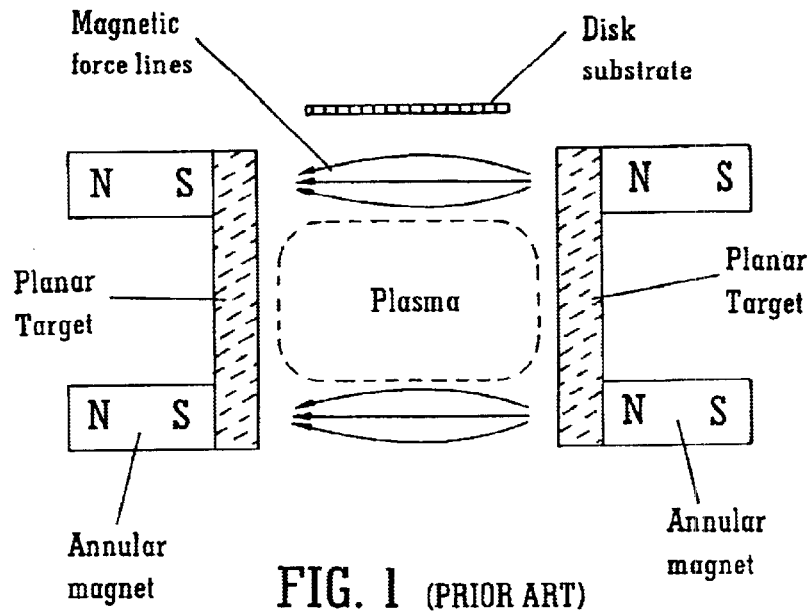
FIG. 1 illustrates, in simplified, schematic cross-sectional view, a conventional facing target sputtering arrangement.
Figure 2A:
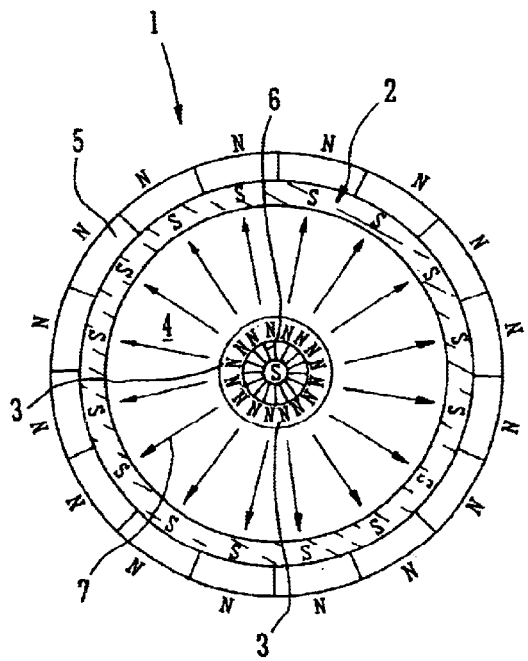
FIGS. 2(A)–2(B), illustrate, in simplified, end and cross-sectional views, respectively, a facing target sputtering arrangement according to an embodiment of the present invention.
Figure 2B:
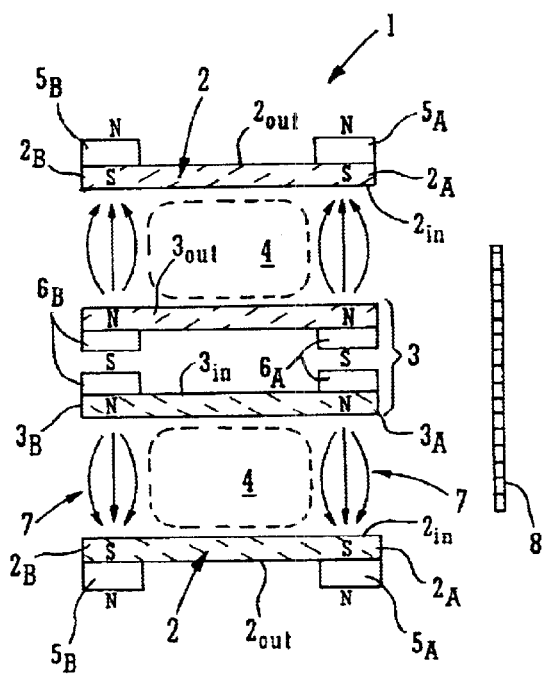

Referring now to FIGS. 2(A)–2(B), illustrated therein, in simplified, end and cross-sectional views, respectively, is an illustrative, but not limitative, embodiment of a facing target arrangement 1 for sputtering according to the present invention. According to the embodiment, facing target arrangement 1 comprises:

(1) a first, or outer, elongated, tubular cathode 2 open at its ends $2_A$ and $2_B$ and having inwardly and outwardly facing surfaces $2_{in}$ and $2_{out}$, respectively, with at least inwardly facing surface $2_{in}$ comprised of a target material to be sputtered;

(2) a second, or inner, elongated, tubular cathode 3, co-extensive with first tubular cathode 2 and concentrically positioned therewith to form an annularly-shaped space 4 therebetween, the second tubular cathode 3 being open at its ends $3_A$ and $3_B$ and having inwardly and outwardly facing surfaces $3_{in}$ and $3_{out}$, respectively, with at least outwardly facing surface $3_{out}$ comprised of the target material to be sputtered;

(3) a first pair of ring-shaped magnet means 5, i.e., $5_A$ and $5_B$, extending around the outwardly facing surface $2_{out}$ of first tubular cathode 2 at respective ends $2_A$ and $2_B$ thereof, with a first polarity magnetic pole (illustratively the south pole S) facing outwardly facing surface $2_{out}$; and (4) a second pair of ring-shaped magnet means 6, i.e., $6_A$ and $6_B$, extending around the inwardly facing surface $3_{in}$ of second tubular cathode 3 at respective ends $3_A$ and $3_B$ thereof, with a first polarity magnetic pole (illustratively the south pole S) facing inwardly facing surface $3_{in}$, with a second polarity (i.e., opposite to the first polarity) magnetic pole (illustratively the north pole N) facing inwardly facing surface $3_{in}$.

During operation of assembly 1, magnetic flux lines 7 traverse opposite ends of the annularly-shaped space 4 between the first and second tubular cathodes 2 and 3, in paths extending from the first pair of magnet means $5_A$ and $5_B$ to respective ones of the second pair of magnet means $6_A$ and $6_B$, or vice versa, to magnetically confine the sputtering plasma to the portion of the annularly-shaped space 4 between the magnetic flux lines 7, as indicated by the dashed lines in the figure. At least one substrate/workpiece 8 is positioned in spaced adjacency to an end of assembly 1 for receipt of a sputtered particle flux emanating from annularly-shaped space 4 between the first and second tubular cathodes 2 and 3.

By way of illustration, but not limitation, a disk-shaped substrate/workpiece 8 is positioned, via a suitable substrate/mounting means (not explicitly shown in the figure for illustrative simplicity), in spaced adjacency to the right end of assembly 1, with the central axis of disk 8 co-axial with that of assembly 1. Illustratively, but not limitatively, the width (i.e., diameter) of the disk-shaped substrate/workpiece 8 is less than the width (i.e., diameter) of the first, or outer, tubular cathode 2 but greater than that of the second, or inner, tubular cathode 3. Also, while each of the first and second tubular cathodes 2, 3 are illustrated in FIGS. 2(A)–2(B) as circular in cross-section (i.e., forming hollow cylinders), the inventive assembly 1 is not limited to use of tubular cathodes in the form of hollow cylinders; i.e., each of the first and second tubular cathodes 2, 3 may, for example, be square- or rectangularly-shaped in cross-section. Further, each of the ring-shaped magnet means 5 and 6 may be comprised of an electromagnet coil or a permanent magnet, e.g., a plurality of smaller permanent magnets with the same polarity orientation, as illustrated in FIGS. 2(A) and 2(B).

The symmetrical design/placement of the target assembly 1 and substrate/workpiece 8 according to the invention facilitate formation of a uniform film across the width (e.g., diameter) thereof, with a reduced likelihood of occurrence of film defects because phenomena such as inter-target arcing leading to defect formation, occurs only within the annular space 4 between the facing targets 2 and 3, well away from the deposition surface of substrate/workpiece 8. Moreover, since the sputtered particle flux impinging the deposition surface of the substrate/workpiece arrives there at via particle scattering, and the distribution of this particle flux is related to the distance between the substrate/workpiece and the facing end of the target assembly, coating thickness uniformity can be readily adjusted, e.g., optimized, by varying the spacing between the substrate/workpiece and the target assembly.

As a consequence of the above-described advantageous features and attributes, the inventive facing target sputtering assembly 1 enjoys particular utility in the manufacture of devices requiring formation of high quality, sputtered, multi-layer thin film structures and laminates, as in the manufacture of high areal density magnetic and/or MO recording media, particularly AFC and perpendicular magnetic recording media requiring very low micro-roughness at film interfaces, few defects, good thickness uniformity, and good repeatability in large-scale, automated manufacturing processing.

Figure 3:
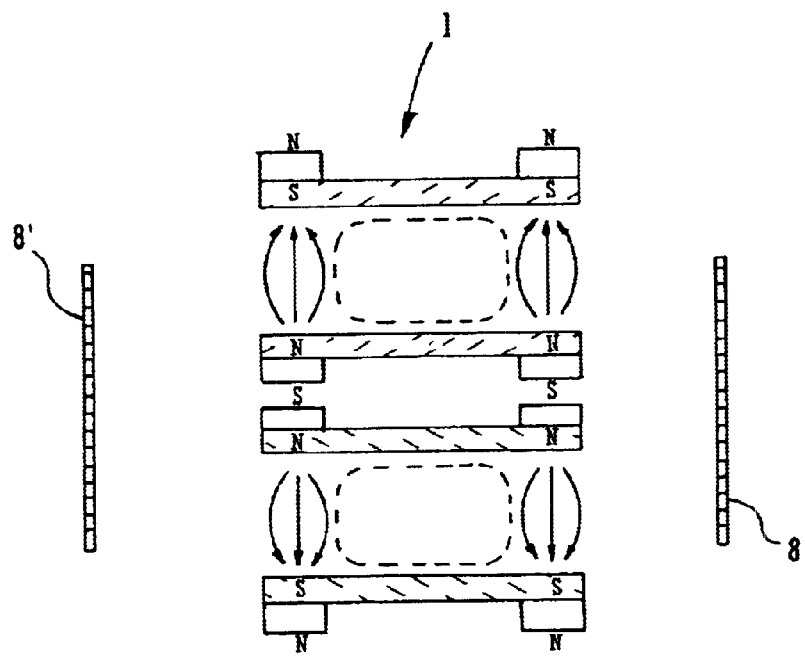
FIGS. 3–4 illustrate, in simplified, schematic cross-sectional views, facing target sputtering arrangements according to further embodiments of the present invention.

FIG. 3 schematically illustrates another embodiment of the invention wherein the embodiment of FIG. 2 is modified to comprise a second substrata/workpiece 8', illustratively a disk-shaped substrate similar to first substrate/workpiece 8, positioned in similar fashion in spaced adjacency to the left end of assembly 1, for receipt thereon of for receipt of a sputtered particle flux emanating from annularly-shaped space between the first and second tubular cathodes. This embodiment is advantageous in performing cost-effective, large-scale manufacturing processing by increasing (i.e., doubling) product throughput from a single target assembly 1.

Figure 4:
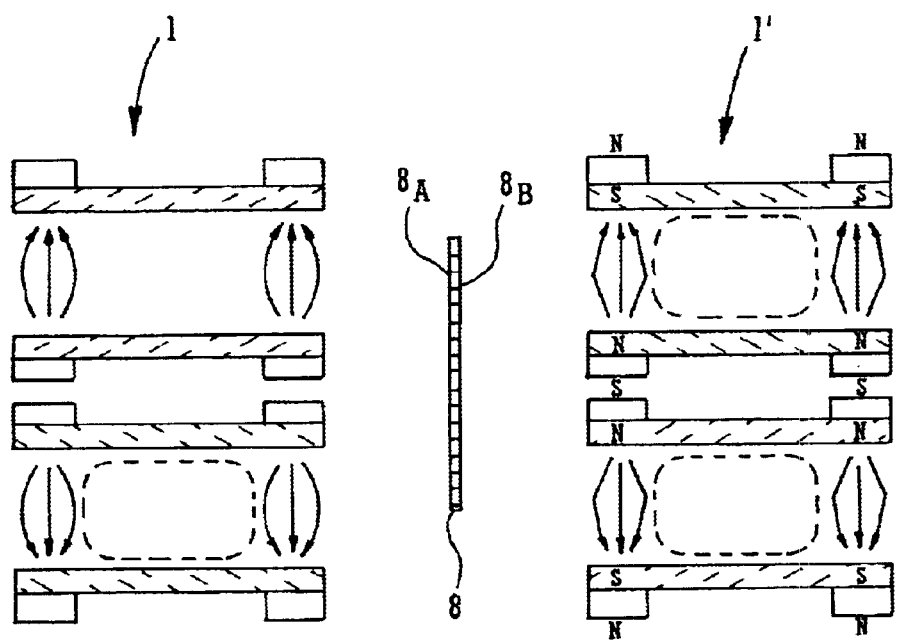

FIG. 4 illustrates still another embodiment of the invention, particularly useful in the manufacture of dual-sided thin film recording media, wherein substrate/workpiece 8 (illustratively disk-shaped) is positioned coaxial with, and between a pair of similarly-configured, tandemly spaced-apart, coaxial target assemblies 1 and 1' for sputter deposition on both sides $8_A$, $8_B$ thereof.

The present invention thus provides a number of advantages over conventional facing target sputter sources utilized in automated manufacturing processing for the deposition of high quality thin film layers and layer stacks having desired physical, electrical, and mechanical properties, such as, for example, employed in the fabrication of magnetic and MO recording media. Further, utilization of the inventive apparatus and methodology as part of conventional manufacturing apparatus can be readily implemented inasmuch as the inventive apparatus and methodology enjoys full compatibility with all other aspects of automated magnetic and MO media manufacture. Finally, the inventive apparatus and methodology are broadly applicable to sputtering processing utilized for the manufacture of a variety of different products, e.g., coated architectural glass and multi-layer optical coatings.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A facing target sputtering source, comprising:
   (a) a first tubular cathode open at each end and having inwardly and outwardly facing surfaces, at least said inwardly facing surface comprised of a target material to be sputtered;
   (b) a second tubular cathode open at each end, co-extensive with and concentrically positioned within said first tubular cathode and forming therebetween an elongated, annularly-shaped space open at each end, said second cathode having inwardly and outwardly facing surfaces, at least said outwardly facing surface comprised of said target material to be sputtered;
   (c) a first pair of ring-shaped magnet means, each extending around a minor portion of said outwardly facing surface of said first tubular cathode at the respective ends thereof, with a first polarity magnetic pole of each of said first pair of magnet means facing said outwardly facing surface of said first cathode; and
   (d) a second pair of ring-shaped magnet means, each extending around a minor portion of said inwardly facing surface of said second tubular cathode at the respective ends thereof, with a second, opposite polarity magnetic pole of each of said second pair of magnet means facing said inwardly facing surface of said second cathode, whereby:
      magnetic flux lines from each of said first and second pairs of magnet means uni-directionally pass through minor portions of said annularly-shaped space between said first and second tubular cathodes at respective ends thereof, and during sputtering operation, plasma is substantially confined to a major portion of said annularly-shaped space located between said magnetic flux lines from said first and second pairs of magnet means.

2. The sputtering source according to claim 1, wherein:
   each of said first and second tubular cathodes (a) and (b) is cylindrical-shaped.

3. The sputtering source according to claim 1, wherein:
   each of said first and second pairs of magnet means (c) and (d) comprises electromagnet means.

4. The sputtering source according to claim 1, wherein:
   each of said first and second pairs of magnet means (c) and (d) comprises permanent magnet means.

5. The sputtering source according to claim 4, wherein:
   each of said pairs of permanent magnet means (c) and (d) comprises a plurality of permanent magnets with the same magnetic polarity orientation.

6. An apparatus for sputter coating at least one surface of at least one substrate/workpiece, comprising the facing target sputter source of claim 1 and at least one substrate/workpiece mounting means for positioning at least one substrate/workpiece in spaced adjacency to an end of said sputter source for receipt of sputtered particle flux emanating from said annularly-shaped space between said first and second tubular cathodes.

7. The apparatus according to claim 6, wherein:
   said at least one substrate/workpiece mounting means is adapted for positioning at least one surface of a disk-shaped substrate/workpiece for sputter coating thereon.

8. The apparatus according to claim 6, comprising:
   a pair of substrate/workpiece mounting means for positioning a pair of substrates/workpieces in spaced adjacency to respective ends of said sputter source for receipt of sputtered particle flux emanating from said annularly-shaped space between said first and second tubular cathodes.

9. The apparatus according to claim 8, wherein:
   each of said pair of substrate/workpiece mounting means is adapted for positioning a surface of a disk-shaped substrate/workpiece for sputter coating thereon.

10. The apparatus according to claim 6, further comprising a coaxial, tandem spaced-apart pair of said facing target sputtering sources, said at least one substrate/workpiece mounting means being located in the space between said pair of sputtering sources for positioning at least one substrate/workpiece in spaced adjacency to respective ends of said sputter sources for receipt of sputtered particle flux on opposite surfaces of said substrate/workpiece.

11. The apparatus according to claim 10, wherein:
    said at least one substrate/workpiece mounting means is adapted for positioning a disk-shaped substrate/workpiece for sputter coating on opposite surfaces thereof.

12. A method of sputter depositing a layer of a target material on at least one surface of at least one substrate/workpiece, comprising the steps of:
    (a) providing a facing target sputtering source for generating a sputtered particle flux, comprising:
       (i) a first tubular cathode open at each end and having inwardly and outwardly facing surfaces, at least said inwardly facing surface comprised of a target material to be sputtered;
       (ii) a second tubular cathode open at each end, co-extensive with and concentrically positioned within said first tubular cathode and forming therebetween an elongated, annularly-shaped space open at each end, said second cathode having inwardly and outwardly facing surfaces, at least said outwardly facing surface comprised of said target material to be sputtered;
       (iii) a first pair of ring-shaped magnet means, each extending around a minor portion of said outwardly facing surface of said first tubular cathode at the respective ends thereof, with a first polarity magnetic pole of each of said first pair of magnet means facing said outwardly facing surface of said first cathode; and (iv) a second pair of ring-shaped magnet means, each extending around a minor portion of said inwardly facing surface of said second tubular cathode at the respective ends thereof, with a second, opposite polarity magnetic pole of each of said second pair of magnet means facing said inwardly facing surface of said second cathode;

(b) passing magnetic flux lines from each of said first and second pairs of magnet means uni-directionally through minor portions of said annularly-shaped space between said first and second tubular cathodes at respective ends thereof;

(c) generating a sputtering plasma between said first and second cathodes which is substantially confined to the portion of said annularly-shaped space located between said magnetic flux lines from said first and second pairs of magnet means; and (d) positioning at least one substrate/workpiece in spaced adjacency to an end of said sputter source for receipt of sputtered particle flux emanating from said annularly-shaped space between said first and second tubular cathodes.

13. The method as in claim 12, wherein:
step (d) comprises positioning at least one surface of a disk-shaped substrate/workpiece for sputter coating thereon.

14. The method as in claim 12, wherein:
step (d) comprises positioning a pair of substrates/workpieces in spaced adjacency to respective ends of said sputter source for receipt of sputtered particle flux emanating from said annularly-shaped space between said first and second tubular cathodes.

15. The method as in claim 14, wherein:
step (d) comprises positioning a pair of disk-shaped substrates/workpieces for sputter coating thereon.

16. The method as in claim 12, wherein:
step (a) comprises providing a coaxial, tandem spaced-apart pair of said facing target sputtering sources; and step (d) comprises positioning said at least one substrate/workpiece in the space between said pair of sputtering sources in spaced adjacency to respective ends of said sputter sources for receipt of sputtered particle flux on opposite surfaces of said substrate/workpiece.

17. The method as in claim 16, wherein:
step (d) comprises positioning a disk-shaped substrate/workpiece for sputter coating on opposite surfaces thereof.

18. The method as in claim 12, wherein:
step (a) comprises providing a said facing target sputtering source wherein at least said inwardly facing surface of said first tubular cathode (i) and at least said outwardly facing surface of said second tubular cathode (ii) are comprised of a target material for forming a layer of a thin-film, multi-layer magnetic or magneto-optical (MO) recording medium.

19. The method as in claim 18, wherein:
step (a) comprises providing a said facing target sputtering source wherein each of said first and second tubular cathodes (i) and (ii) are cylindrical-shaped; and step (d) comprises positioning at least one surface of a disk-shaped substrate/workpiece for sputter coating at least one layer of said thin-film, multi-layer magnetic or MO recording medium thereon.

* * * * *